(12) United States Patent
Lee et al.

(10) Patent No.: US 12,022,717 B2
(45) Date of Patent: Jun. 25, 2024

(54) DISPLAY APPARATUS

(71) Applicant: SAMSUNG DISPLAY CO., LTD., Yongin-si (KR)

(72) Inventors: Eonjoo Lee, Yongin-si (KR); Kwangwoo Park, Yongin-si (KR); Donghwan Shim, Yongin-si (KR); Jinyong Lee, Yongin-si (KR); Cheol Jang, Yongin-si (KR); Yongseon Jo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/110,802

(22) Filed: Feb. 16, 2023

(65) Prior Publication Data
US 2024/0081123 A1   Mar. 7, 2024

(30) Foreign Application Priority Data

Sep. 5, 2022 (KR) .......................... 10-2022-0112345

(51) Int. Cl.
*H10K 59/40* (2023.01)
*G06F 3/044* (2006.01)
(Continued)

(52) U.S. Cl.
CPC ........... *H10K 59/40* (2023.02); *G06F 3/0446* (2019.05); *H10K 59/1213* (2023.02); *H10K 59/1216* (2023.02); *H10K 59/122* (2023.02); *H10K 59/879* (2023.02); *H10K 59/8792* (2023.02); *H10K 59/88* (2023.02); *G06F 2203/04112* (2013.01)

(58) Field of Classification Search
CPC .... H10K 59/40; H10K 59/122; H10K 59/879; H10K 59/1213; H10K 59/88; H10K 59/1216; H10K 59/8792; G06F 3/0446; G06F 2203/04112
See application file for complete search history.

(56) References Cited

U.S. PATENT DOCUMENTS 7,094,122 B2    8/2006  Toguchi et al.
2014/0077196 A1*  3/2014  Shim .................. H10K 59/1315
                                                349/59
(Continued)

FOREIGN PATENT DOCUMENTS

CN    110534551 A    12/2019
KR    100495703 B1    6/2005
(Continued)

*Primary Examiner* — Lisa S Landis
(74) *Attorney, Agent, or Firm* — CANTOR COLBURN LLP

(57) ABSTRACT

A display apparatus includes a substrate, a first light-emitting element disposed over the substrate to emit light, a first dummy light-emitting element disposed over the substrate to emit light of a same color as a color of the light emitted from the first light-emitting element, an input sensing layer disposed on the first light-emitting element and the first dummy light-emitting element, and a light-blocking layer disposed on the input sensing layer, where an opening is defined through the light-blocking layer to overlap the first light-emitting element, and the input sensing layer includes a diffraction structure disposed to overlap the first dummy light-emitting element.

20 Claims, 10 Drawing Sheets

(51) Int. Cl.
    *H10K 59/121*     (2023.01)
    *H10K 59/122*     (2023.01)
    *H10K 59/80*     (2023.01)
    *H10K 59/88*     (2023.01)

(56) References Cited

U.S. PATENT DOCUMENTS

2021/0376007 A1    12/2021    Choi et al.
2022/0005874 A1    1/2022    Oh et al.

FOREIGN PATENT DOCUMENTS

| KR | 1020050068973 A | 7/2005 |
| KR | 101274687 B1 | 6/2013 |
| KR | 20200079904 A | 7/2020 |
| KR | 1020210149280 A | 12/2021 |
| KR | 1020220003687 A | 1/2022 |

* cited by examiner

DISPLAY APPARATUS

This application claims priority to Korean Patent Application Nos. 10-2022-0112345, filed on Sep. 5, 2022, and all the benefits accruing therefrom under 35 U.S.C. § 119, the content of which in its entirety is herein incorporated by reference.

BACKGROUND

1. Field

One or more embodiments relate to an apparatus, and more particularly, to a display apparatus.

2. Description of the Related Art

Recently, mobile or portable electronic apparatuses are widely used in various fields. For example, tablet personal computers (PCs) as well as miniaturized electronic apparatuses, such as mobile phones, have recently become widely used as mobile electronic apparatuses.

Such a mobile electronic apparatus may include a display apparatus to provide a user with visual information, such as images. Recently, as the parts driving a display apparatus have been miniaturized, the proportion of the display apparatus in an electronic apparatus has gradually increased and a display apparatus having a structure that may be bent to form a preset angle in a flattened state is also under development.

SUMMARY

One or more embodiments include a display apparatus in which a width of an opening of a bank layer and a width of an opening of a light-blocking layer corresponding to a dummy light-emitting element are reduced by arranging a dummy light-emitting element in the bank layer and a diffraction structure.

According to one or more embodiments, a display apparatus includes a substrate, a first light-emitting element disposed over the substrate, where the first light-emitting element emits light, a first dummy light-emitting element disposed over the substrate, where the first dummy light-emitting element emits light of a same color as a color of the light emitted from the first light-emitting element, an input sensing layer disposed on the first light-emitting element and the first dummy light-emitting element, and a light-blocking layer disposed on the input sensing layer, where an opening is defined through the light-blocking layer to overlap the first light-emitting element, and the input sensing layer includes a diffraction structure disposed on the first dummy light-emitting element.

In an embodiment, the input sensing layer may include at least one insulating layer, and the diffraction structure may include at least one hole defined through the at least one insulating layer.

In an embodiment, the input sensing layer may further include an upper insulating layer at least partially filling the at least one hole.

In an embodiment, a refractive index of the upper insulating layer may be less than a refractive index of the at least one insulating layer.

In an embodiment, the at least one insulating layer may include a first sub-insulating layer and a second sub-insulating layer on the first sub-insulating layer, and a refractive index of the second sub-insulating layer may be less than a refractive index of the first sub-insulating layer.

In an embodiment, the display apparatus may further include a pixel circuit including a thin-film transistor and a storage capacitor, and the pixel circuit may be electrically connected to the first light-emitting element and the first dummy light-emitting element.

In an embodiment, each of the first light-emitting element and the first dummy light-emitting element may include a first electrode, a light-emitting material disposed on the first electrode, and a second electrode disposed on the light-emitting material, where the first electrode of the first light-emitting element may be connected to the first electrode of the first dummy light-emitting element.

In an embodiment, the input sensing layer may include a plurality of touch electrodes, and the plurality of touch electrodes may include metal lines crossing each other to have a mesh shape in a plan view, wherein each of the metal lines may extend from a crossing point of the metal lines, and the first dummy light-emitting element may overlap the crossing point of the metal lines.

In an embodiment, the light-blocking layer may overlap the first dummy light-emitting element.

In an embodiment, the display apparatus may further include a second dummy light-emitting element arranged to be adjacent to the first dummy light-emitting element and spaced apart in a first direction from the first dummy light-emitting element, a third dummy light-emitting element arranged to be adjacent to the first dummy light-emitting element and spaced apart from the first dummy light-emitting element in a second direction crossing the first direction, and a fourth dummy light-emitting element spaced apart in the first direction from the third dummy light-emitting element and spaced apart in the second direction from the second dummy light-emitting element.

In an embodiment, the first dummy light-emitting element may emit light of a same color as a color of light of the fourth dummy light-emitting element, the second dummy light-emitting element may emit light of a same color as a color of light of the third dummy light-emitting element, which is different from the color of light of the fourth dummy light-emitting element.

In an embodiment, the first dummy light-emitting element may emit light of a color different from a color of light of the fourth dummy light-emitting element, and the second dummy light-emitting element may emit light of a color different from a color of light of the third dummy light-emitting element.

In an embodiment, the first dummy light-emitting element, the second dummy light-emitting element, the third dummy light-emitting element, and the fourth dummy light-emitting element may emit light of a same color as each other.

According to one or more embodiments, a display apparatus includes a substrate, a first light-emitting element disposed over the substrate, where the first light-emitting element emits light, a first dummy light-emitting element disposed over the substrate, where the first dummy light-emitting element emits light of a same color as a color of the light emitted from the first light-emitting element, a light-blocking layer disposed on the first light-emitting element and the first dummy light-emitting element, where the light-blocking layer includes a light-blocking portion, through which an opening is defined, the opening corresponds to the first light-emitting element, and the light-blocking portion corresponds to the first dummy light-emitting element, and at least one insulating layer disposed between the first dummy light-emitting element and the light-blocking layer, where the at least one insulating layer includes a diffraction structure in which at least one hole is defined.

In an embodiment, the display apparatus may further include a bank layer disposed on a first electrode of the first light-emitting element, where a first light-emitting opening may be defined through the bank layer to the first electrode, and a width of the first light-emitting opening of the bank layer may be less than a width of the opening of the light-blocking layer.

In an embodiment, a first electrode of the first dummy light-emitting element may be connected to the first electrode of the first light-emitting element.

In an embodiment, the display apparatus may further include an upper insulating layer disposed on the at least one insulating layer and partially filling the at least one hole of the diffraction structure.

In an embodiment, a refractive index of the upper insulating layer may be less than a refractive index of the at least one insulating layer.

In an embodiment, the at least one insulating layer may include a first sub-insulating layer and a second sub-insulating layer on the first sub-insulating layer, and a refractive index of the second sub-insulating layer may be less than a refractive index of the first sub-insulating layer.

In an embodiment, the display apparatus may further include a plurality of touch electrodes disposed on the first light-emitting element and the first dummy light-emitting element, where the plurality of touch electrodes may include metal lines crossing each other to have a mesh shape in a plan view, where each of the metal lines may extend from a crossing point of the metal lines, and the first dummy light-emitting element may overlap the crossing point of the metal lines.

These and/or other features of embodiments of the invention will become apparent and more readily appreciated from the following detailed description of the embodiments, the accompanying drawings, and claims.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
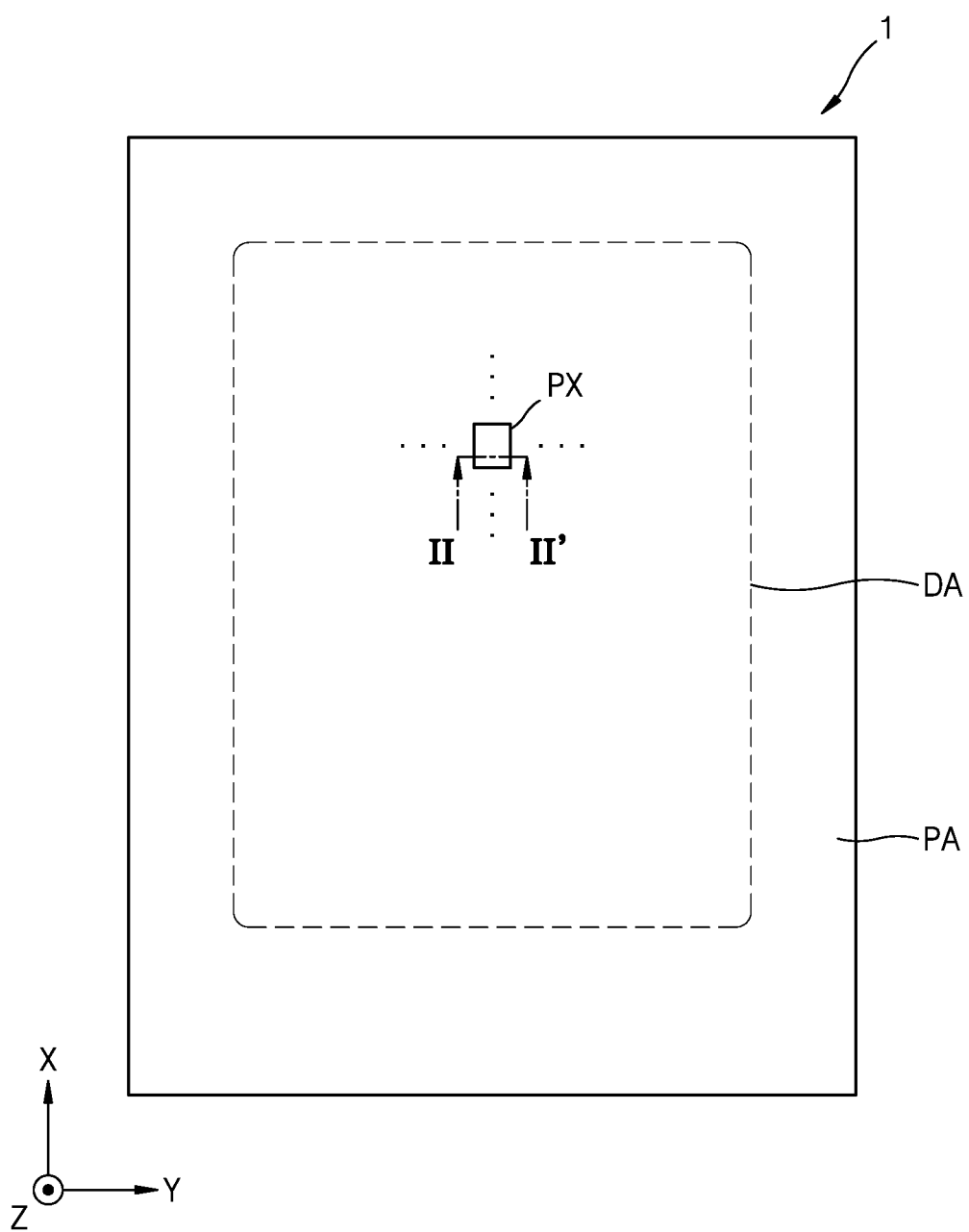
FIG. 1 is a schematic plan view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Sizes of elements in the drawings may be exaggerated or reduced for convenience of explanation. As an example, the size and thickness of each element shown in the drawings are arbitrarily represented for convenience of description, and thus, the present disclosure is not necessarily limited thereto.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the X-axis, the Y-axis and the Z-axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

In the case where a certain embodiment may be implemented differently, a specific process order may be performed in the order different from the described order. As an example, two processes successively described may be simultaneously performed substantially and performed in the opposite order.

Hereinafter, embodiments of the invention will be described with reference to the accompanying drawings, in which like reference numerals refer to like elements throughout and any repetitive detailed description thereof is omitted.

FIG. 1 is a schematic plan view of a display apparatus 1 according to an embodiment.

Referring to FIG. 1, an embodiment of the display apparatus 1 may include a display area DA and a peripheral area PA outside the display area DA. The display apparatus 1 may be configured to display images through an array of a plurality of pixels PX arranged two-dimensionally in the display area DA, e.g., on a plane defined by the X-axis direction and the Y-axis direction. Here, the Z-axis direction perpendicular to the X-axis direction and the Y-axis direction may be a thickness direction of the display apparatus 1.

The peripheral area PA is a region that does not display images and may surround the display area DA entirely or partially. A driver and the like configured to provide electric signals or power to pixel circuits respectively corresponding to the pixels PX may be arranged in the peripheral area PA. A pad may be arranged in the peripheral area PA, where the pad is a region to which electronic elements or a printed circuit board may be electrically connected.

Hereinafter, although embodiments where the display apparatus 1 includes an organic light-emitting diode OLED as a light-emitting element will be described in detail for convenience of description, the display apparatus 1 according to an embodiment is not limited thereto. In an alternative embodiment, the display apparatus 1 may be a light-emitting display apparatus including an inorganic light-emitting diode, that is, an inorganic light-emitting display apparatus. The inorganic light-emitting diode may include a PN diode including inorganic material semiconductor-based materials. When a forward voltage is applied to a PN-junction diode, holes and electrons are injected and energy created by recombination of the holes and the electrons is converted to light energy, and thus, light of a preset color may be emitted. The inorganic light-emitting diode may have a width of several micrometers to hundreds of micrometers. In another alternative embodiment, the display apparatus 1 may be a quantum-dot light-emitting display apparatus.

The display apparatus 1 according to an embodiment may be used as a display screen in various products including televisions, notebook computers, monitors, advertisement boards, Internet of things (IoTs) apparatuses as well as portable electronic apparatuses including mobile phones, smart phones, tablet personal computers (PCs), mobile communication terminals, electronic organizers, electronic books, portable multimedia players (PMPs), navigations, and ultra mobile personal computers (UMPCs). In addition, the display apparatus 1 according to an embodiment may be used in wearable devices including smartwatches, watch-phones, glasses-type displays, and head-mounted displays (HMDs). In addition, in an embodiment, the display apparatus 1 is used as a display screen in instrument panels for automobiles, center fascias for automobiles, or center information displays (CIDs) arranged on a dashboard, room mirror displays that replace side mirrors of automobiles, and displays arranged on the backside of front seats as an entertainment for back seats of automobiles.

Figure 2:
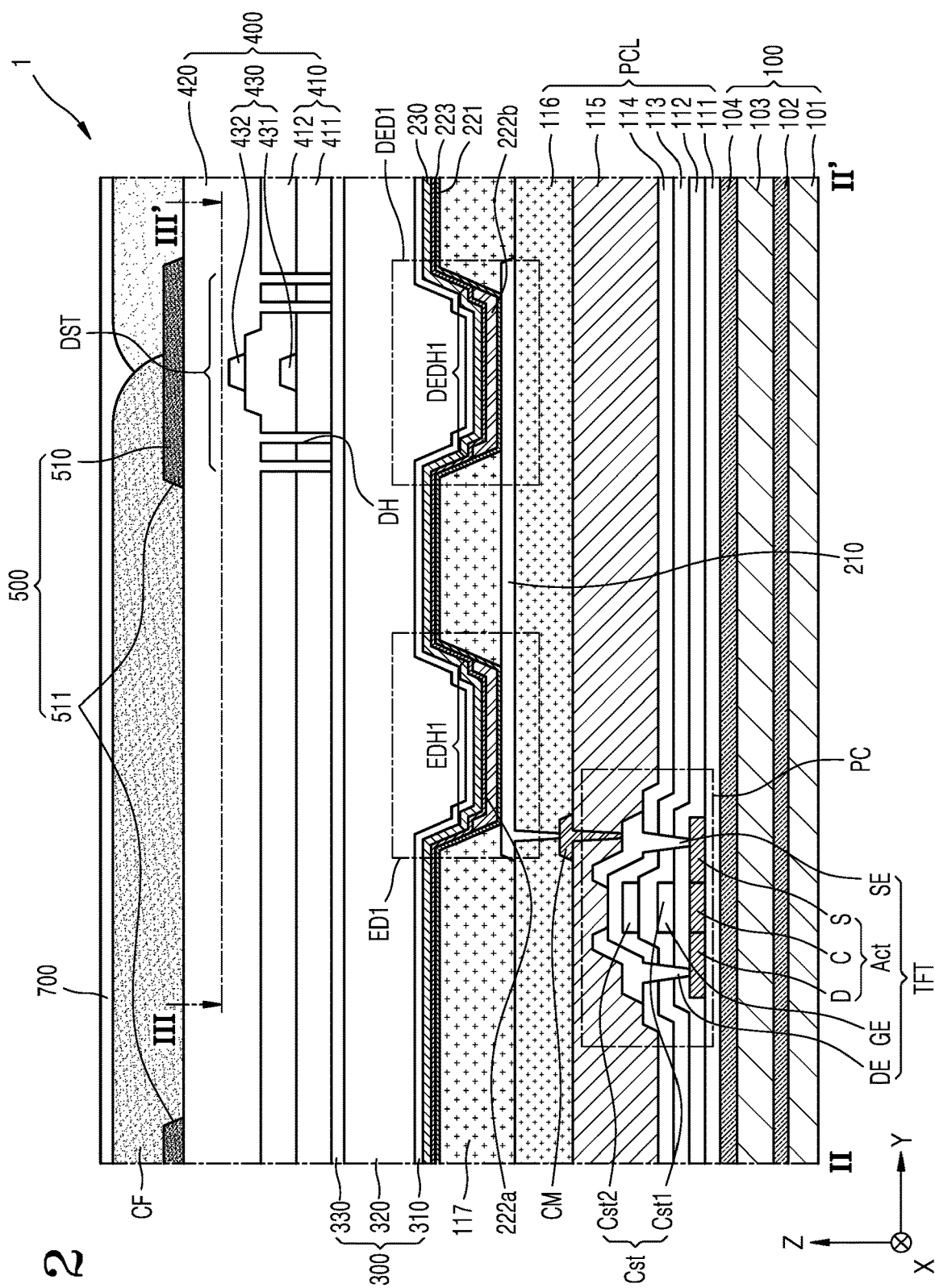
FIG. 2 is a cross-sectional view of a display apparatus, taken along line II-II' of FIG. 1, according to an embodiment.

FIG. 2 is a cross-sectional view of the display apparatus 1, taken along line II-II' of FIG. 1, according to an embodiment;

Referring to FIG. 2, an embodiment of the display apparatus 1 may include a stack structure of a substrate 100, a pixel circuit layer PCL, a display element layer, an encapsulation layer 300, an input sensing layer 400, an anti-reflection layer, and an overcoat layer 700.

The substrate 100 may have a multi-layered structure including a base layer that includes polymer resin and an inorganic layer. In an embodiment, for example, the substrate 100 may include the base layer including polymer resin and a barrier layer including an inorganic insulating layer. In an embodiment, for example, the substrate 100 may include a first base layer 101, a first barrier layer 102, a second base layer 103, and a second barrier layer 104 that are sequentially stacked one on another. The first base layer 101 and the second base layer 103 may each include polyimide (PI), polyethersulfone (PES), polyacrylate, polyetherimide (PEI), polyethylene naphthalate (PEN), polyethylene terephthalate (PET), polyphenylene sulfide (PPS), polycarbonate, cellulose tri acetate (TAC), and/or cellulose acetate propionate (CAP). The first barrier layer 102 and the second barrier layer 104 may each include an inorganic insulating material such as silicon oxide, silicon oxynitride, and/or silicon nitride. The substrate 100 may be flexible.

The pixel circuit layer PCL including a pixel circuit PC may be disposed on the substrate 100. For convenience of illustration, FIG. 2 shows one of a plurality of thin-film transistors TFT included in the pixel circuit PC. In such an embodiment, as shown in FIG. 2, the pixel circuit layer PCL includes a buffer layer 111, a first gate insulating layer 112, a second gate insulating layer 113, an interlayer insulating layer 114, a first planarization insulating layer 115, and a second planarization insulating layer 116, which are disposed below and/or over elements of the thin-film transistor TFT.

The buffer layer 111 may reduce or block penetration of foreign materials, moisture, or external air from below the substrate 100 and provide a flat surface on the substrate 100. The buffer layer 111 may include an inorganic insulating material such as silicon nitride, silicon oxynitride or silicon oxide, and have a single-layered structure or a multi-layered structure, each layer therein including at least one selected from the above materials.

The thin-film transistor TFT may include a semiconductor layer Act on the buffer layer 111, where the semiconductor layer Act may include polycrystalline silicon (poly-Si). Alternatively, the semiconductor layer Act may include amorphous silicon (a-Si), an oxide semiconductor, or an organic semiconductor. The semiconductor layer Act may include a channel region C, a drain region D, and a source region S respectively arranged on two opposite sides of the channel region C. A gate electrode GE may overlap the channel region C.

The gate electrode GE may include a low-resistance metal material. The gate electrode GE may include a conductive material including molybdenum (Mo), aluminum (Al), copper (Cu), and titanium (Ti) and have a single-layered structure or a multi-layered structure, each layer therein including at least one selected from the above materials. The gate electrode GE may overlap the channel region C.

The first gate insulating layer 112 between the semiconductor layer Act and the gate electrode GE may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Here, zinc oxide ($ZnO_x$) may be zinc oxide (ZnO) and/or zinc peroxide ($ZnO_2$).

The second gate insulating layer 113 may cover the gate electrode GE. Similar to the first gate insulating layer 112, the second gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Here, zinc oxide ($ZnO_x$) may be zinc oxide (ZnO) and/or zinc peroxide ($ZnO_2$).

An upper electrode Cst2 of the storage capacitor Cst may be disposed on the second gate insulating layer 113. The upper electrode Cst2 may overlap the gate electrode GE therebelow. In such an embodiment, the gate electrode GE and the upper electrode Cst2 overlapping each other with the second gate insulating layer 113 therebetween may constitute (or collectively define) the storage capacitor Cst. That is, the gate electrode GE may serve as a lower electrode Cst1 of the storage capacitor Cst.

As described above, the storage capacitor Cst may overlap the thin-film transistor TFT. In an alternative embodiment, the storage capacitor Cst may be formed not to overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and have a single-layered structure or a multi-layered structure, each layer therein including at least one selected from the above materials.

The interlayer insulating layer 114 may cover the upper electrode Cst2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Here, zinc oxide ($ZnO_x$) may be zinc oxide (ZnO) and/or zinc peroxide ($ZnO_2$). The interlayer insulating layer 114 may have a single-layered structure or a multi-layered structure, each layer therein including at least one selected from the inorganic insulating material.

The drain electrode DE and the source electrode SE may each be disposed on the interlayer insulating layer 114. The drain electrode DE and the source electrode SE may be respectively connected to the drain region D and the source region S through contact holes defined through insulating layers therebelow. The drain electrode DE and the source electrode SE may each include a material having high conductivity. The drain electrode DE and the source electrode SE may each include a conductive material including at least one selected from molybdenum (Mo), aluminum (Al), copper (Cu), and titanium (Ti) and may each have a single-layered structure or a multi-layered structure, each layer therein including at least one selected from the above materials. In an embodiment, the drain electrode DE and the source electrode SE may each have a multi-layered structure of Ti/Al/Ti.

The first planarization insulating layer 115 may cover the drain electrode DE and the source electrode SE. The first planarization insulating layer 115 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The second planarization insulating layer 116 may be disposed on the first planarization insulating layer 115. The second planarization insulating layer 116 may include the same material as a material of the first planarization insulating layer 115 and may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The display element layer may be disposed on the pixel circuit layer PCL having the above structure. The display element layer may include a first light-emitting element ED1 electrically connected to the pixel circuit PC. The first light-emitting element ED1 may include a first electrode 210, a first common layer 221, an emission layer 222a, and a second electrode 230. The first light-emitting element ED1 may be configured to emit, for example, red, green, or blue light, or emit red, green, blue, or white light.

The first electrode 210 may be disposed on the second planarization insulating layer 116. The first electrode 210 may be electrically connected to the thin-film transistor TFT through contact holes defined or formed in the second planarization insulating layer 116 and the first planarization insulating layer 115, and a contact metal CM disposed on the first planarization insulating layer 115.

In an embodiment, the first electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an alternative embodiment, the first electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another alternative embodiment, the first electrode 210 may further include a layer including ITO, IZO, ZnO, or $In_2O_3$ and disposed on or under the reflective layer.

A bank layer 117 may be disposed on the first electrode 210. In an embodiment, a first light-emitting opening EDH1 is defined through the bank layer 117 to expose at least a portion of the first electrode 210. The first light-emitting opening EDH1 may define an emission area through which light from the first light-emitting element ED1 is emitted. The size/width of the first light-emitting opening EDH1 may correspond to the size/width of the emission area of the first light-emitting element ED1.

The bank layer 117 may include, for example, an organic material such as polyimide or hexamethyldisiloxane (HMDSO). Alternatively, the bank layer 117 may include a light-blocking insulating material. The bank layer 117 may be a colored opaque light-blocking insulating layer and viewed as black, for example. In an embodiment, for example, the bank layer 117 may include a polyimide (PI)-based binder and pigment in which red, green, and blue are mixed. Alternatively, the bank layer 117 may include a binder and a mixture of lactam black pigment and blue pigment. Alternatively, the bank layer 117 may include carbon black. The bank layer 117 may be configured to improve contrast of the display apparatus.

The emission layer 222a may be disposed in the first light-emitting opening EDH1 defined in the bank layer 209.

The emission layer 222a may include an organic material including a fluorescent or phosphorous material for emitting red, green, blue, or white light. The emission layer 222a may be an organic emission layer including a low-molecular weight organic material or a polymer organic material. In an embodiment, for example, the emission layer 222a is an organic emission layer and may include copper phthalocyanine, tris-8-hydroxyquinoline aluminum, poly-phenylenevinylene-based material, or polyfluorene-based material.

The second electrode 230 may be disposed on the emission layer 222a. The second electrode 230 may be a light-transmissive electrode or a reflective electrode. In an embodiment, the second electrode 230 may be a transparent or semi-transparent electrode and may include a thin metal film including Li, Ca, LiF/Ca, LiF/Al, Al, Ag, Mg, or a compound thereof and having a small work function. In addition, the second electrode 230 may further include a transparent conductive oxide (TCO) layer such as ITO, indium zinc oxide (IZO), ZnO, or $In_2O_3$ as well as the thin metal film.

In an embodiment, a hole transport region may be defined between the first electrode 210 and the emission layer 222a, and an electron transport region may be defined between the emission layer 222a and the second electrode 230.

The hole transport region may have a single-layered structure or a multi-layered structure. In an embodiment, for example, a first common layer 221 may be arranged in the hole transport region. In an embodiment, the first common layer 221 may include at least one selected from a hole injection layer (NIL), a hole transport layer (HTL), and an electron blocking layer (EBL).

In an embodiment, for example, the first common layer 221 may have a single-layered structure or a multi-layered structure. In an embodiment where the first common layer 221 has a multi-layered structure, the first common layer 221 may include an HIL and HTL sequentially stacked from the first electrode 221a, include an HIL and an EBL, include an HTL and an EBL, or include an HIL, an HTL, and an EBL. However, the embodiment is not limited thereto.

The first common layer 221 may include at least one selected from m-MTDATA, TDATA, 2-TNATA, NPB (NPD), β-NPB, TPD, Spiro-TPD, Spiro-NPB, methylated-NPB, TAPC, HMTPD, TCTA (4,4',4"-tris(N-carbazolyl)triphenylamine (4,4',4"-tris(N-carbazolyl)triphenylamine)), pani/DBSA (polyaniline/dodecylbenzenesulfonic acid), pani/CSA (polyaniline/camphor sulfonic acid)), PEDOT/PSS (poly(3,4-ethylenedioxythiophene)/poly(4-styrenesulfonate) (poly(3,4-ethylenedioxythiophene))/poly(4-styrenesulfonate))) and PAN I/PSS (polyaniline/poly(4-styrenesulfonate) (polyaniline/poly(4-styrenesulfonate))).

The electron transport region may have a single-layered structure or a multi-layered structure. In an embodiment, for example, a second common layer 223 may be arranged in the electron transport region. In an embodiment, the second common layer 223 may include at least one selected from an electron injection layer (EIL), an electron transport layer (ETL), and a hole blocking layer (HBL).

In an embodiment, for example, the second common layer 223 may have a single-layered structure or a multi-layered structure. In an embodiment where the second common layer 223 has a multi-layered structure, the second common layer 223 may include an ETL and EIL sequentially stacked in a direction facing the second electrode 230 from the emission layer 222a, include an HBL and an EIL, include an HBL and an ETL, or include an HBL, an ETL, and an EIL. However, the embodiment is not limited thereto.

The second common layer 223 may include at least one selected from BCP (2,9-dimethyl-4,7-diphenyl-1,10-phenanthroline), Bphen (4,7-Diphenyl-1,10-phenanthroline), Alq3, BAlq, TAZ (3-(biphenyl-4-yl)-5-(4-tert-butylphenyl)-4-phenyl-4H-1,2,4-triazole) and NTAZ.

In an embodiment, the display element layer may further include a first dummy light-emitting element DED1 arranged to be adjacent to the first light-emitting element ED1.

The first dummy light-emitting element DED1 may be disposed over the substrate 100 and may include the first electrode 210, the first common layer 221, a dummy emission layer 222b, the second common layer 223, and the second electrode 230. The first electrode 210 of the first dummy light-emitting element DED1 may overlap a first dummy light-emitting opening DEDH1 defined in the bank layer 209. The dummy emission layer 222b may overlap the first electrode 210 of the first dummy light-emitting element DED1 through the first dummy light-emitting opening DEDH1 of the bank layer 209. The width of the first dummy light-emitting opening DEDH1 may be less than the width of the first light-emitting opening EDH1. The second electrode 230 may be disposed on the dummy emission layer 222b. The first common layer 221 may be disposed between the first electrode 210 of the first dummy light-emitting element DED1 and the dummy emission layer 222b, and the second common layer 223 may be disposed between the dummy emission layer 222b of the first dummy light-emitting element DED1 and the second electrode 230.

The first common layer 221 of the first dummy light-emitting element DED1 and the first common layer 221 of the first light-emitting element ED1 may be integrally formed with each other as a single unitary and indivisible part. The second common layer 223 of the first dummy light-emitting element DED1 and the second common layer 223 of the first light-emitting element ED1 may be integrally formed with each other as a single unitary and indivisible part. The second electrode 230 of the first dummy light-emitting element DED1 and the second electrode 230 of the first light-emitting element ED1 may be integrally formed with each other as a single unitary and indivisible part. In such an embodiment, the first common layer 221, the second common layer 223, and the second electrode 230 may be shared by the first light-emitting element ED1 and the first dummy light-emitting element DED1. The first common layer 221, the second common layer 223, and the second electrode 230 may each be formed by an open mask having a size of a degree capable of covering the display area DA entirely.

The first electrode 210 of the first light-emitting element ED1 may be integrally connected with the first electrode 210 of the first dummy light-emitting element DED1. In such an embodiment, a portion of the first electrode 210 may correspond to (or define) the first electrode 210 of the first light-emitting element ED1, and another portion of the first electrode 210 may correspond to the first electrode 210 of the first dummy light-emitting element DED1. Accordingly, the first light-emitting element ED1 and the first dummy light-emitting element DED1 may be electrically connected to a same pixel circuit PC.

The emission layer 222a and the dummy emission layer 222b may include a light-emitting material that emit light of a same color as each other, and the first dummy light-emitting element DED1 may be configured to emit light of a same color as a color of light emitted from the first light-emitting element ED1. Although FIG. 2 shows an embodiment where the emission layer 222a is apart from the dummy emission layer 222b with the bank layer 117 therebetween, this is only an example, and alternatively, the emission layer 222a may be connected to the dummy emission layer 222b on the bank layer 117.

The encapsulation layer 300 may be disposed on the display element layer and may cover the display element layer. In an embodiment, for example, the encapsulation layer 300 may be disposed on the second electrode 230. The encapsulation layer 300 may include at least one inorganic encapsulation layer and at least one organic encapsulation layer. In an embodiment, as shown in FIG. 2, the encapsulation layer 300 includes a first inorganic encapsulation layer 310, an organic encapsulation layer 320, and a second inorganic encapsulation layer 330, where the organic encapsulation layer 320 may be on the first inorganic encapsulation layer 310, and the second inorganic encapsulation layer 330 may be on the organic encapsulation layer 320.

The first inorganic encapsulation layer 310 and the second inorganic encapsulation layer 330 may include at least one inorganic material selected from aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate. The organic encapsulation layer 320 may be formed by curing a monomer or coating a polymer. The organic encapsulation layer 320 may be transparent.

The input sensing layer 400 may be disposed on the encapsulation layer 300. The input sensing layer 400 may obtain coordinate information corresponding to an external input, for example, a touch event. The input sensing layer 400 may be configured to sense an external input by using, for example, a capacitive method. In embodiments of the disclosure, a method of operating the input sensing layer 400 is not particularly limited. In an embodiment, the input sensing layer 400 may be configured to sense an external input by using an electromagnetic induction method or a pressure sensing method.

The input sensing layer 400 may include at least one insulating layer 410, an upper insulating layer 420, and a touch conductive layer 430.

The at least one insulating layer 410 may be disposed between the first dummy light-emitting element DED1 and a light-blocking layer 500 described below. The at least one insulating layer 410 may have a single-layered structure or a multi-layered structure. In an embodiment, as shown in FIG. 2, the at least one insulating layer 410 includes a first sub-insulating layer 411 and a second sub-insulating layer 412 on the first sub-insulating layer 411. The at least one insulating layer 410 may include an inorganic insulating material. In an embodiment, for example, at least one of the first sub-insulating layer 411 and the second sub-insulating layer 412 may include an inorganic layer. The inorganic layer may include at least one selected from aluminum oxide, titanium oxide, silicon oxide, silicon oxynitride, zirconium oxide, and hafnium oxide.

At least a portion of the upper insulating layer 420 may be disposed on at least one insulating layer 410. The upper insulating layer 420 may include an organic insulating material.

The touch conductive layer 430 may include a plurality of touch electrodes. The touch conductive layer 430 may include a first touch conductive layer 431 and a second touch conductive layer 432. The first touch conductive layer 431 may be disposed between the first sub-insulating layer 411 and the second sub-insulating layer 412. Also, the second touch conductive layer 432 may be disposed between the second sub-insulating layer 412 and the upper insulating layer 420. The first touch conductive layer 431 and the second touch conductive layer 432 may include a metal. In an embodiment, for example, each of the first touch conductive layer 431 and the second touch conductive layer 432 may have a three-layered structure of a titanium layer, an aluminum layer, and a titanium layer.

Each of the first touch conductive layer 431 and the second touch conductive layer 432 may include a plurality of patterns. In an embodiment, the first touch conductive layer 431 may include first conductive patterns, and the second touch conductive layer 432 may include second conductive patterns.

The input sensing layer 400 includes touch electrodes, and each touch electrode may include metal lines GL forming a mesh structure. At least one selected from the first conductive patterns and the second conductive patterns may include the metal lines GL.

The anti-reflection layer may be disposed on the input sensing layer 400. The anti-reflection layer may include the light-blocking layer 500 and a color filter CF.

The light-blocking layer 500 may include a light-blocking portion 510 and an opening 511 passing through the light-blocking portion 510.

The light-blocking portion 510 may include a light-blocking insulating material. Accordingly, the light-blocking portion 510 is a colored opaque light-blocking insulating layer and may be viewed as black, for example. In an embodiment, for example, the light-blocking portion 510 may include a polyimide (PI)-based binder and pigment in which red, green, and blue are mixed. Alternatively, the light-blocking portion 510 may include a binder and a mixture of lactam black pigment and blue pigment. Alternatively, the light-blocking portion 510 may include carbon black.

The opening 511 of the light-blocking layer 500 may correspond to the first light-emitting opening EDH1 of the bank layer 117. In an embodiment, for example, the opening 511 of the light-blocking layer 500 may overlap the first light-emitting element ED1. Light emitted from the first light-emitting element ED1 may pass through the opening 511 of the light-blocking layer 500.

The light-blocking portion 510 of the light-blocking layer 500 may correspond to the first dummy light-emitting opening DEDH1 of the bank layer 117. Accordingly, the light-blocking portion 510 of the light-blocking layer 500 may overlap the first dummy light-emitting element DED1. Most of light emitted from the first dummy light-emitting element DED1 may be blocked by the light-blocking portion 510 of the light-blocking layer 500.

The light-blocking portion 510 of the light-blocking layer 500 may overlap the metal line GL of the touch electrode.

The width of the opening 511 of the light-blocking layer 500 may be equal to or greater than the width of the first dummy light-emitting opening DEDH1. In an embodiment, for example, as shown in FIG. 2, the width of the opening 511 of the light-blocking layer 500 may be greater than the width of the first light-emitting opening EDH1. Among light emitted from the first dummy light-emitting element DED1, light progressing toward the opening 511 of the light-blocking layer 500 may pass through the opening 511 of the light-blocking layer 500 and increase brightness of the display apparatus 1.

The color filter CF may be disposed on the opening 511 of the light-blocking layer 500. The light-blocking layer 500 may contact the color filter CF. The color filter CF may be configured to transmit only light in a specific wavelength band to which light emitted from the first light-emitting element ED1 disposed thereunder belongs.

The color filter CF may reduce external light reflection in which external light is reflected by the first light-emitting element ED1 and viewed by users. In an embodiment, for example, the first light-emitting element ED1 may be configured to emit red light, and the color filter CF corresponding to the first light-emitting element ED1 may be a red color filter configured to pass only light in a wavelength band corresponding to the red light.

When external light reaches the color filter CF corresponding to the first light-emitting element ED1, only light having a wavelength in the wavelength band corresponding to the red light may pass through the color filter CF and light in the other wavelength bands may be absorbed by the color filter CF. Accordingly, among light incident to the display apparatus 1, only light having a wavelength in the wavelength band corresponding to the red light may pass through the color filter CF, and a portion thereof may be reflected by the first electrode 210 or the second electrode 230 therebelow and emitted again to the outside. Consequently, because only a portion of external light is incident to where the first light-emitting element ED1 is located, external light reflection may be reduced.

The overcoat layer 700 may be disposed on the anti-reflection layer. The overcoat layer 700 may be configured to planarize the upper surface of the color filter CF in a direction (i.e., the +Z-axis direction) away from (or a thickness direction of) the substrate 100. The overcoat layer 700 is transparent and may not have a color corresponding to light corresponding to a visible wavelength band. Accordingly, the overcoat layer 700 may be configured to pass light in various wavelength bands, not light in a specific wavelength band. In an embodiment, for example, the overcoat layer 700 may include an organic insulating material such as a silicon-based resin, an acryl-based resin, an epoxy-based region, polyimide, or a polyethylene.

The input sensing layer 400 may include a diffraction structure DST disposed on the first dummy light-emitting element DED1. At least a portion of light emitted from the first dummy light-emitting element DED1 may be diffracted while passing through the diffraction structure DST. At least a portion of diffracted light may pass through the opening 511 of the light-blocking layer 500, light emitted from the first light-emitting element ED1 and light emitted from the first dummy light-emitting element DED1 and diffracted by the diffraction structure DST may pass through the opening 511 of the light-blocking layer 500 and be viewed by users, and thus, the brightness of the display apparatus 1 may be increased.

In such an embodiment including the diffraction structure DST, even in a case where the width of the first light-emitting opening EDH1 and the width of the opening 511 of the light-blocking layer 500 are reduced, the brightness of the display apparatus 1 may be secured. In such an embodiment, because the width of the first light-emitting opening EDH1 and the width of the opening 511 of the light-blocking layer 500 are reduced, external light reflection may be reduced. Accordingly, in such an embodiment, while the brightness of the display apparatus 1 is secured, external light reflection may be reduced.

The diffraction structure DST may include at least one hole DH defined through at least one insulating layer 410. At least a portion of light emitted from the first dummy light-emitting element DED1 may be diffracted while passing through the at least one hole DH.

The upper insulating layer 420 may at least partially fill the at least one hole DH. A refractive index of the upper insulating layer 420 may be less than a refractive index of the at least one insulating layer 410. When a difference between the refractive index of the upper insulating layer 420 and the refractive index of the at least one insulating layer 410 is large, the degree of diffraction of light passing through the diffractive structure DST may increase. The degree of diffraction of light passing through the diffractive structure DST may be determined by adjusting a difference between the refractive index of the at least one insulating layer 410 and the refractive index of the upper insulating layer 420. In an embodiment, for example, the upper insulating layer 420 may fill the at least one hole DH entirely. In an embodiment, the upper insulating layer 420 may contact the encapsulation layer 300 through the at least one hole DH.

The refractive index of the second sub-insulating layer 412 may be less than the refractive index of the first sub-insulating layer 411. When a difference between the refractive index of the first sub-insulating layer 411 and the refractive index of the second sub-insulating layer 412 is large, the degree of diffraction of light passing through the diffractive structure DST may increase. Accordingly, the degree of diffraction of light passing through the diffractive structure DST may be determined by adjusting a difference between the refractive index of the first sub-insulating layer 411 and the refractive index of the second sub-insulating layer 412.

Figure 3:
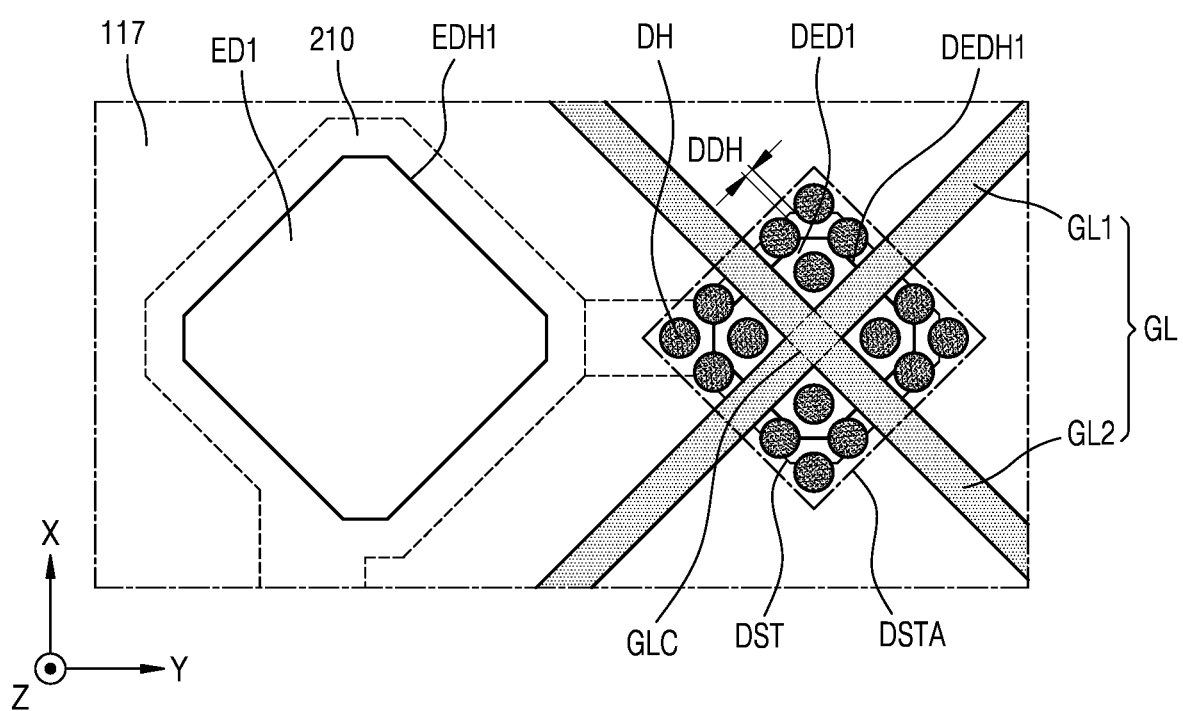
FIG. 3 is a plan view of a display apparatus, taken along line III-III' of FIG. 2, according to an embodiment.

FIG. 3 is a plan view of a display apparatus, taken along line III-III' of FIG. 2 according to an embodiment.

Edges of the first electrodes 210 (see FIG. 2) the first light-emitting element ED1 and the first dummy light-emitting element DED1 overlap each other, and thus, are shown in a dashed line.

At least one of the touch electrodes described with reference to FIG. 2 may include metal lines GL having a mesh structure. In an embodiment, as shown in FIG. 3, the metal lines GL include a first metal line GL1 and a second metal line GL2 crossing each other. The first metal line GL1 and the second metal line GL2 may cross each other at a crossing point GLC and extend integrally from the crossing point GLC. In an embodiment, an angle between the first metal line GL1 and the second metal line GL2 may be about 90°. In such an embodiment, the first metal line GL1 and the second metal line GL2 may have a mesh shape in a plan view.

The first dummy light-emitting element DED1 may overlap the crossing point GLC of the plurality of metal lines GL. In an embodiment, for example, in a plan view, the crossing point GLC of the plurality of metal lines GL may overlap the first dummy light-emitting opening DEDH1. The first metal line GL1 and the second metal line GL2 may not overlap the first light-emitting opening EDH1. Accordingly, the first metal line GL1 and the second metal line GL2 may not screen light emitted from the first light-emitting element ED1.

An area (or a diffraction structure area) DSTA, in which the diffraction structure DST is arranged, may overlap the first dummy light-emitting opening DEDH1. The central portion of the area DSTA in which the diffraction structure DST is arranged may be arranged to overlap the crossing point GLC of the plurality of metal lines GL. The area DSTA in which the diffraction structure DST is arranged may be divided into four areas by the first metal line GL1 and the second metal line GL2. In a plan view, the four areas may be symmetrical to each other with respect to the crossing point GLC of the first metal line GL1 and the second metal line GL2. In an embodiment, for example, in a plan view, the shape of the area DSTA in which the diffraction structure DST is arranged may be a quadrangle, and the shapes of the four areas divided by the first metal line GL1 and the second metal line GL2 may be also quadrangles.

At least one hole DH defined through the at least one insulating layer 410 (see FIG. 2) may overlap the first dummy light-emitting element DED1. The at least one hole DH may not overlap the plurality of metal lines GL. The at least one hole DH may be provided in plurality. The plurality of holes DH may be arranged in a lattice shape in each of the four areas divided by the first metal line GL1 and the second metal line GL2 in the area DSTA in which the diffraction structure DST is arranged. In an embodiment, as shown in FIG. 3, the plurality of holes DH may be arranged in two rows and two columns in each of the fourth areas, but this is only an example, and the number of the plurality of holes in each of the four areas is not limited thereto.

When an interval DDH between the plurality of holes DH is narrow, the degree of diffraction of light emitted from the first dummy light-emitting element DED1. In addition, as the number of the plurality of holes DH increases, the degree of diffraction of light emitted from the first dummy light-emitting element DED1 may increase. Accordingly, in an embodiment, the interval DDH between the plurality of holes DH and the number of the plurality of holes DH may be determined based on the degree of diffraction of light in the diffraction structure DST.

Figure 4:
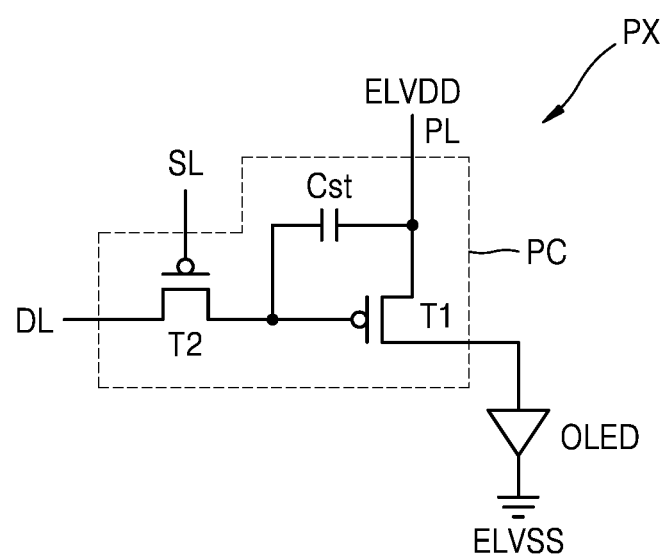
FIG. 4 is an equivalent circuit diagram of a pixel of a display apparatus according to an embodiment.

FIG. 4 is an equivalent circuit diagram of a pixel of the display apparatus 1 according to an embodiment.

In an embodiment, each pixel PX may include a pixel circuit PC and a display element connected to the pixel circuit PC, where the display element may be, for example, an organic light-emitting diode OLED. The pixel circuit PC may include a first thin-film transistor T1, a second thin-film transistor T2, and a storage capacitor Cst. The pixel circuit PC may be electrically connected to the first light-emitting element ED1 and the first dummy light-emitting element DED1. Each pixel PX may be configured to emit, for example, red, green, blue, or white light from the organic light-emitting diode OLED.

The second thin-film transistor T2 is a switching thin-film transistor, may be connected to a scan line SL and a data line DL, and configured to transfer a data voltage to the first thin-film transistor T1 based on a switching voltage, where the data voltage is input from the data line DL, and the switching voltage is input from the scan line SL. The storage capacitor Cst may be connected to the second thin-film transistor T2 and a driving voltage line PL and configured to store a voltage corresponding to a difference between a voltage transferred from the second thin-film transistor T2 and a first power voltage ELVDD supplied to the driving voltage line PL.

The first thin-film transistor T1 is a driving thin-film transistor, may be connected to the driving voltage line PL and the storage capacitor Cst, and configured to control a driving current based on the voltage stored in the storage capacitor Cst, the driving current flowing from the driving voltage line PL to the organic light-emitting diode OLED. The organic light-emitting diode OLED may be configured to emit light having a preset brightness corresponding to the driving current. A second electrode (e.g., a cathode) of the organic light-emitting diode OLED may receive a second power voltage ELVSS.

In an embodiment, as shown in FIG. 4, the pixel circuit PC may include two thin-film transistors and a single storage capacitor, but the embodiment is not limited thereto. The number of thin-film transistors and the number of storage capacitors may be variously changed according to the design of the pixel circuit PC. In an alternative embodiment, for example, the pixel circuit PC may further include four or more thin-film transistors as well as the two thin-film transistors.

Figure 5:
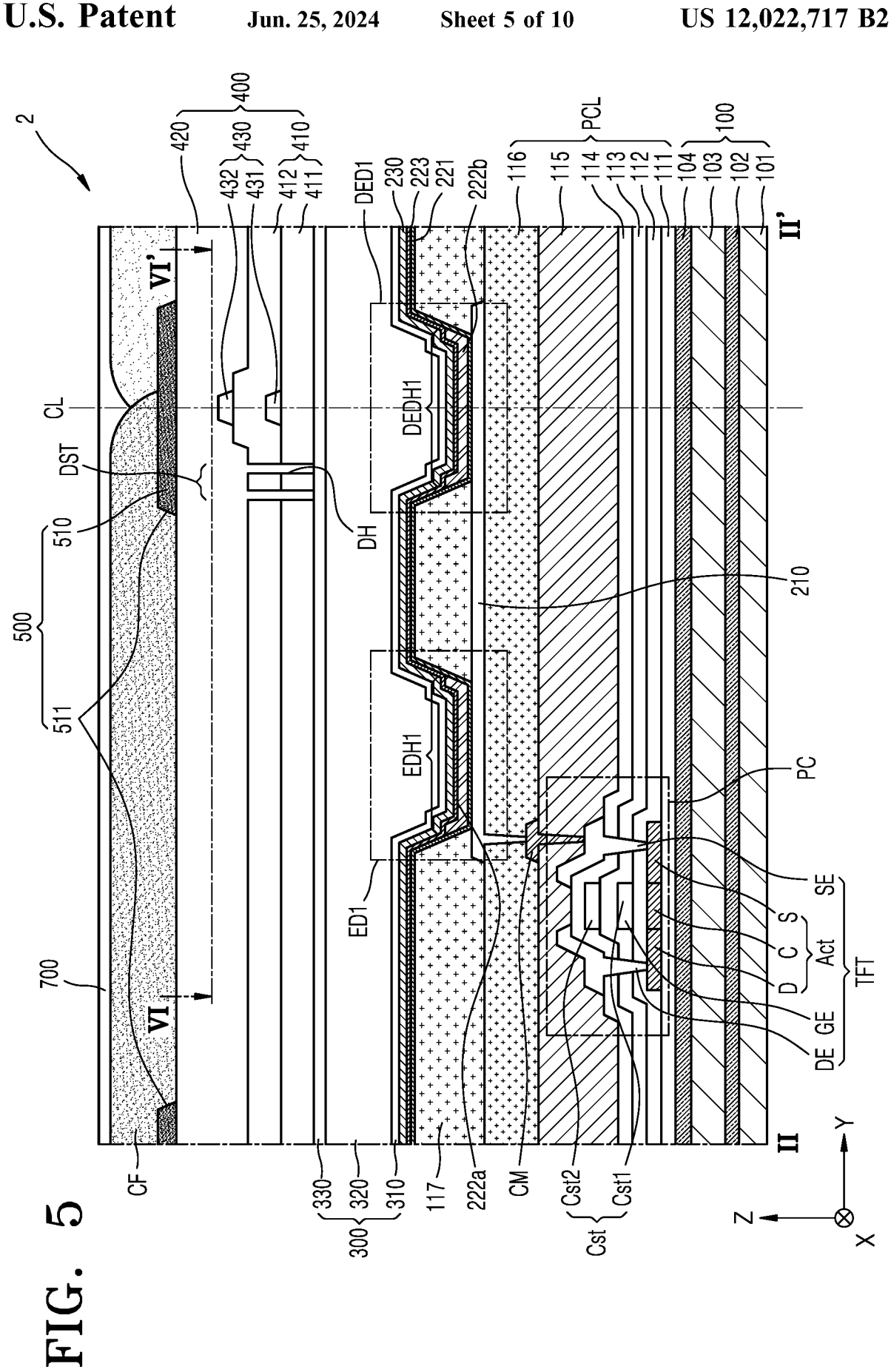
FIG. 5 is a cross-sectional view of a display apparatus, taken along line II-II' of FIG. 1, according to an alternative embodiment.
Figure 6:
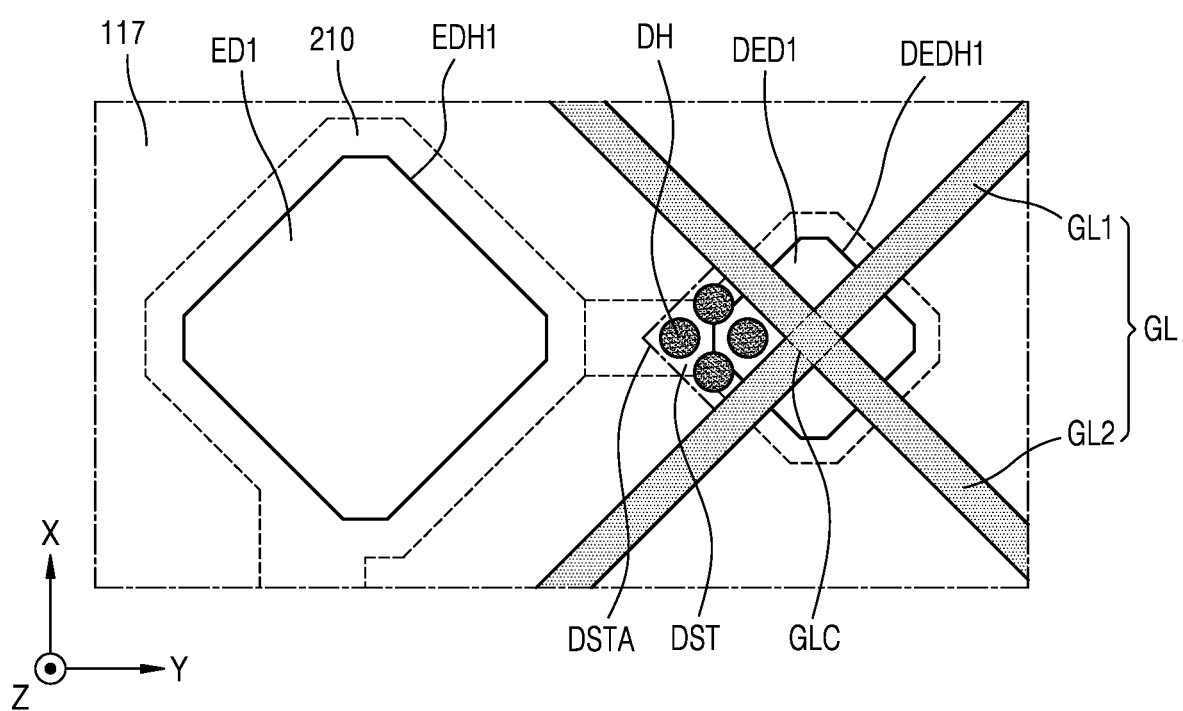
FIG. 6 is a plan view of a display apparatus, taken along line IV-IV' of FIG. 5, according to an alternative embodiment.

FIG. 5 is a cross-sectional view of a display apparatus, taken along line II-II' of FIG. 1 according to an alternative embodiment, and FIG. 6 is a plan view of a display apparatus, taken along line IV-IV' of FIG. 5 according to an alternative embodiment.

In FIGS. 5 and 6, the same reference numerals as those of FIGS. 1 to 4 denote the same members, and thus, any repeated detailed descriptions thereof are omitted.

In an embodiment, as shown in FIG. 5, the diffraction structure DST of a display apparatus 2 may be arranged in a region adjacent to the first light-emitting element ED1 with respect to an imaginary central line CL passing through the center of the first dummy light-emitting opening DEDH1 in the third direction Z. In such an embodiment, as shown in FIG. 6, in a plan view, the diffraction structure DST may be arranged in the region adjacent to the first light-emitting element ED1 with respect to the mesh shape of the plurality of metal lines GL.

In such an embodiment, light emitted from the first dummy light-emitting element DED1 may be diffracted toward only a direction approaching the opening 511 of the light-blocking layer 500 overlapping the first light-emitting element ED1. Accordingly, a phenomenon that light emitted from the first dummy light-emitting element DED1 passes through an opening (not shown) of the light-blocking layer 500 that does not overlap the first light-emitting element ED1 may be effectively prevented.

FIGS. 7 to 10 are plan views of a portion of a display apparatus according to alternative embodiments.

Referring to FIGS. 7 to 10, in an embodiment, the display apparatus may further include a second light-emitting element ED2, a second dummy light-emitting element DED2 configured to emit a same light as light of the second light-emitting element ED2, a third light-emitting element ED3, a third dummy light-emitting element DED3 configured to emit a same light as light of the third light-emitting element ED3, a fourth light-emitting element ED4, a fourth dummy light-emitting element DED4 configured to emit a same light as light of the fourth light-emitting element ED4, a fifth light-emitting element ED5, a sixth light-emitting element ED6, a seventh light-emitting element ED7, and an eighth light-emitting element ED8, in addition to the first light-emitting element ED1 and the first dummy light-emitting element DED1 described with reference to FIGS. 1 to 4.

In such an embodiment, the first light-emitting element ED1, the second light-emitting element ED2, the third light-emitting element ED3, the fourth light-emitting element ED4, the fifth light-emitting element ED5, the sixth light-emitting element ED6, the seventh light-emitting element ED7, and the eighth light-emitting element ED8 in FIGS. 7 to 10 are substantially the same as or similar to the first light-emitting element ED1 described with reference to FIGS. 1 to 4, and thus, any repetitive detailed descriptions thereof are omitted.

In such an embodiment, the first dummy light-emitting element DED1, the second dummy light-emitting element DED2, the third dummy light-emitting element DED3, and the fourth dummy light-emitting element DED4 in FIGS. 7 to 10 are substantially the same as or similar to the first dummy light-emitting element DED1 described with reference to FIGS. 1 to 4, and thus, any repetitive detailed descriptions thereof are omitted.

In such an embodiment, as described above, external light reflection in the first light-emitting element ED1, the second light-emitting element ED2, the third light-emitting element ED3, the fourth light-emitting element ED4 may be reduced.

In a plan view, the second dummy light-emitting element DED2 may be arranged to be adjacent to the first dummy light-emitting element DED1 and be apart in a first direction (e.g., a +Y-axis direction) from the first dummy light-emitting element DED1. The third dummy light-emitting element DED3 may be arranged to be adjacent to the first dummy light-emitting element DED1 and be apart in a second direction (e.g., a −X direction) crossing the first direction (e.g., the +Y-axis direction) from the first dummy light-emitting element DED1. The fourth dummy light-emitting element DED4 may be apart in the first direction (e.g., the +Y-axis direction) from the third dummy light-emitting element DED3 and be apart in the second direction (e.g., the −X-axis direction) from the second dummy light-emitting element DED2. In an embodiment, for example, an angle between the first direction (e.g., the +Y-axis direction) and the second direction (e.g., the −X-axis direction) may be about 90°.

Figure 7:
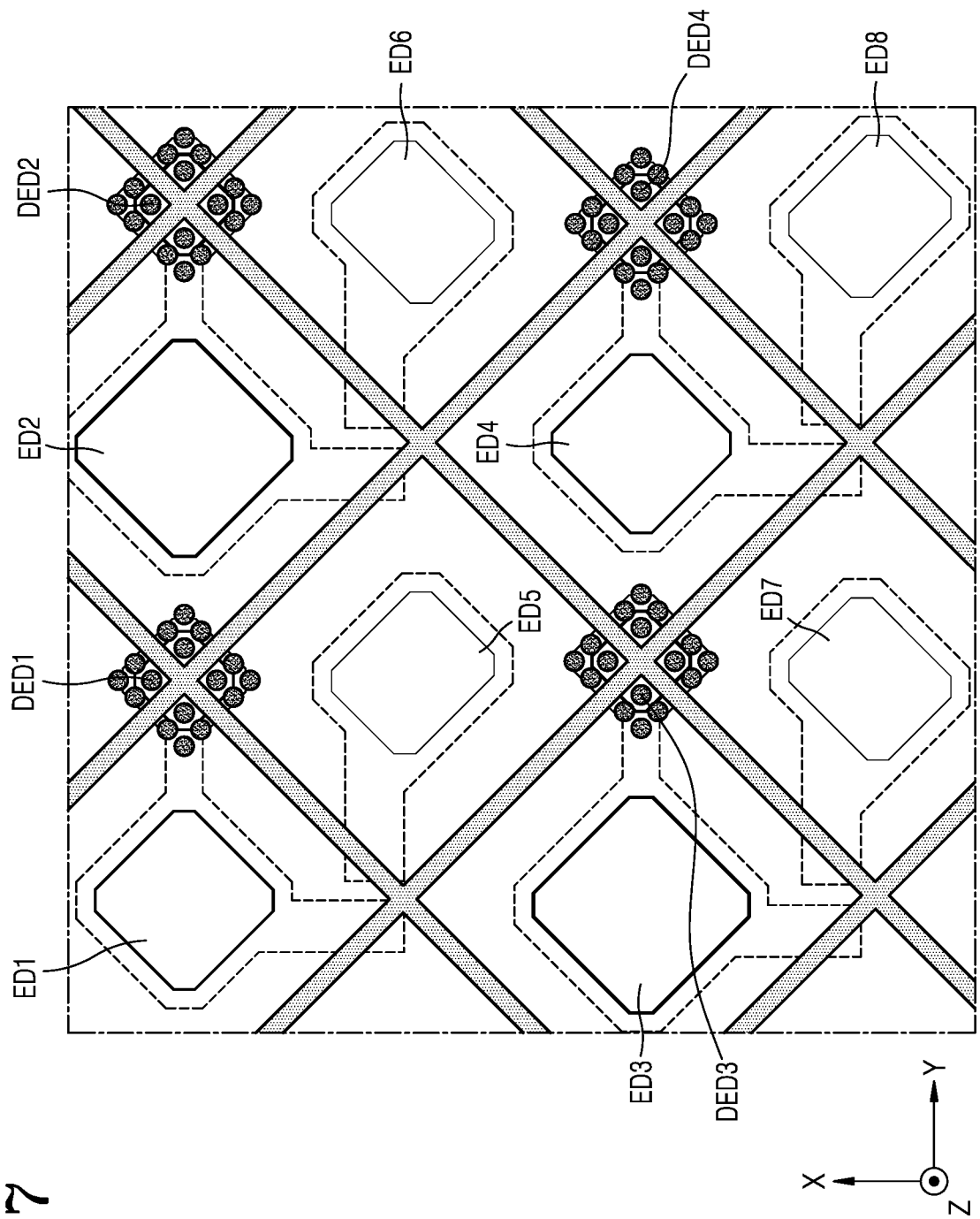
FIGS. 7 to 10 are plan views of a portion of a display apparatus according to alternative embodiments.

Referring to FIG. 7, in an embodiment, the first light-emitting element ED1 may be apart in a third direction (e.g., a −Y-axis direction) opposite to the first direction (e.g., the +Y-axis direction) from the first dummy light-emitting element DED1, the second light-emitting element ED2 may be apart in the third direction (e.g., the −Y-axis direction) from the second dummy light-emitting element DED2, the third light-emitting element ED3 may be apart in the third direction (e.g., the −Y-axis direction) from the third dummy light-emitting element DED3, and the fourth light-emitting element ED4 may be apart in the third direction (e.g., the −Y-axis direction) from the fourth dummy light-emitting element DED4.

The fifth light-emitting element ED5 may be arranged between the first dummy light-emitting element DED1 and the third dummy light-emitting element DED3, and the sixth light-emitting element ED6 may be arranged between the second dummy light-emitting element DED2 and the fourth dummy light-emitting element DED4. The seventh light-emitting element ED7 may be apart in the second direction (e.g., the −X-axis direction) from the third dummy light-emitting element DED3, and the eighth light-emitting element ED8 may be apart in the second direction (e.g., the −X-axis direction) from the fourth dummy light-emitting element DED4.

The first light-emitting element ED1, the first dummy light-emitting element DED1, the fourth light-emitting element ED4, and the fourth dummy light-emitting element DED4 may be configured to emit light of a first color. The second light-emitting element ED2, the second dummy light-emitting element DED2, the third light-emitting element ED3, and the third dummy light-emitting element DED3 may be configured to emit light of a second color. The fifth light-emitting element ED5, the sixth light-emitting element ED6, the seventh light-emitting element ED7, and the eighth light-emitting element ED8 may be configured to emit light of a third color. The first color, the second color, and the third color may be different colors. In an embodiment, for example, the first color may be red, the second color may be blue, and the third color may be green.

Figure 8:
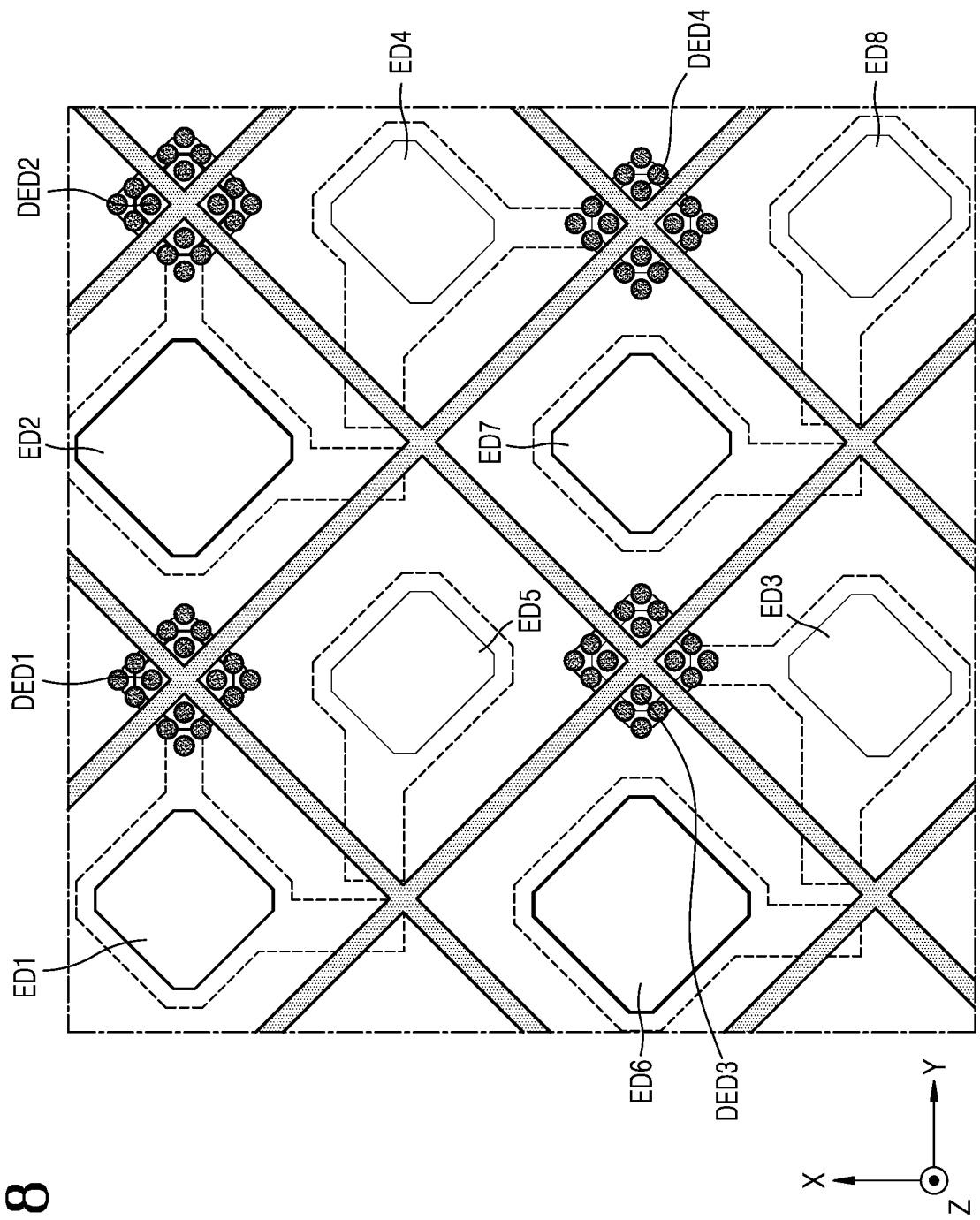

Referring to FIG. 8, in an alternative embodiment, the first light-emitting element ED1 may be arranged to be apart in a third direction (e.g., a −Y-axis direction) from the first dummy light-emitting element DED1, the second light-emitting element ED2 may be arranged to be apart in the third direction (e.g., the −Y-axis direction) from the second dummy light-emitting element DED2, the third light-emitting element ED3 may be arranged in the second direction (e.g., the −X-axis direction) from the third dummy light-emitting element DED3, and the fourth light-emitting element ED4 may be arranged between the second dummy light-emitting element DED2 and the fourth dummy light-emitting element DED4.

The fifth light-emitting element ED5 may be arranged between the first dummy light-emitting element DED1 and the third dummy light-emitting element DED3, the sixth light-emitting element ED6 may be arranged to be apart in the third direction (e.g., the −Y-axis direction) from the third dummy light-emitting element DED3, the seventh light-emitting element ED7 may be arranged between the third dummy light-emitting element DED3 and the fourth dummy light-emitting element DED4, and the eighth light-emitting element ED8 may be arranged to be apart in the second direction (e.g., the −X-axis direction) from the fourth dummy light-emitting element DED4.

In such an embodiment, the first light-emitting element ED1, the first dummy light-emitting element DED1, and the seventh light-emitting element ED7 may be configured to emit light of the first color. The second light-emitting element ED2, the second dummy light-emitting element DED2, and the sixth light-emitting element ED6 may be configured to emit light of the second color. The third light-emitting element ED3, the third dummy light-emitting element DED3, the fourth light-emitting element ED4, the fourth dummy light-emitting element DED4, the fifth light-emitting element ED5, and the eighth light-emitting element ED8 may be configured to emit light of a third color. The first color, the second color, and the third color may be different colors from each other. In an embodiment, for example, the first color may be red, the second color may be blue, and the third color may be green.

Figure 9:
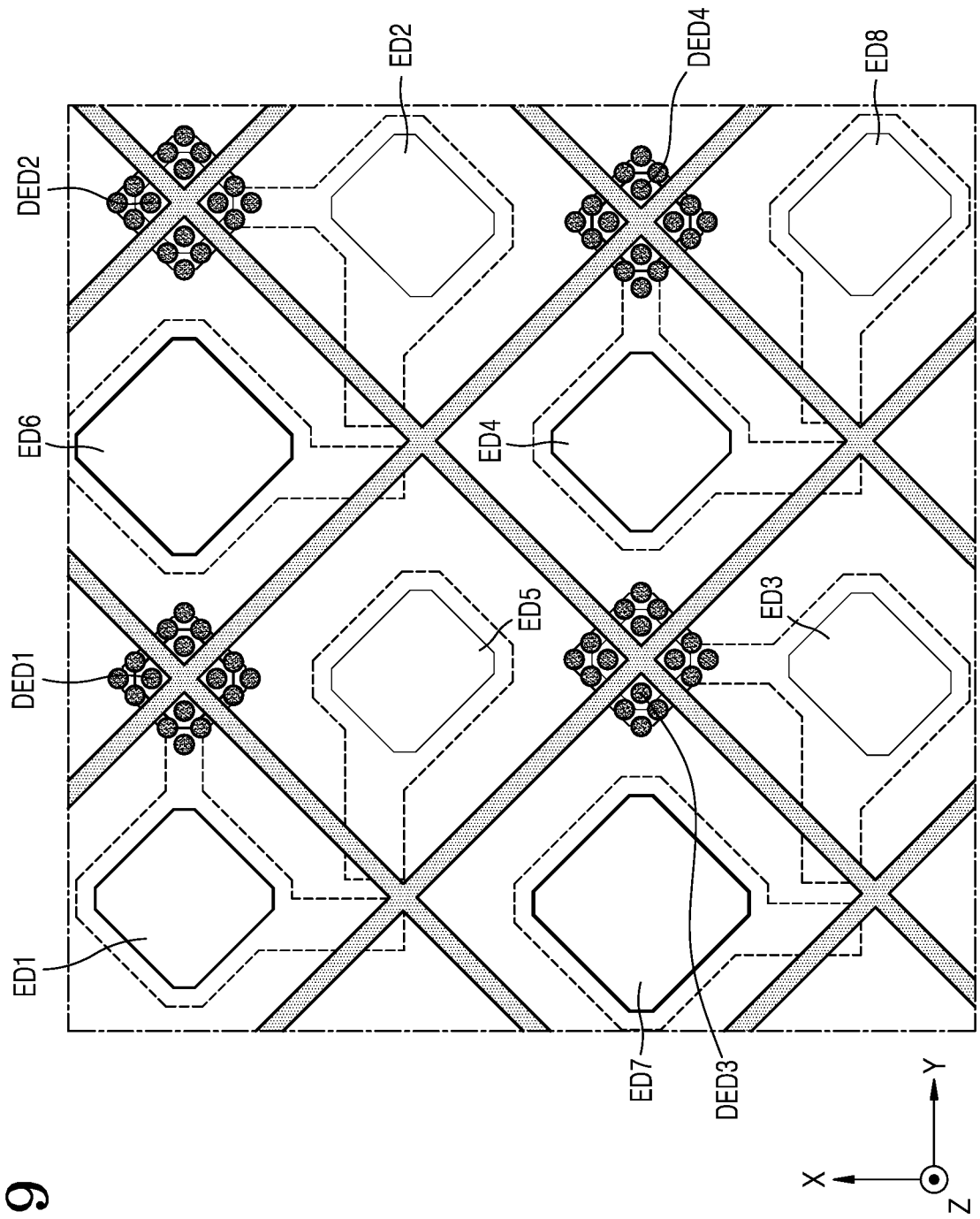

Referring to FIG. 9, in another alternative embodiment, the first light-emitting element ED1 may be arranged to be apart in the third direction (e.g., the −Y-axis direction) from the first dummy light-emitting element DED1, the second light-emitting element ED2 may be arranged between the second dummy light-emitting element DED2 and the fourth dummy light-emitting element DED4, the third light-emitting element ED3 may be arranged to be apart in the second direction (e.g., the −X-axis direction) from the third dummy light-emitting element DED3, and the fourth dummy light-emitting element DED4 may be arranged between the third dummy light-emitting element DED3 and the fourth dummy light-emitting element DED4.

The fifth light-emitting element ED5 may be arranged between the first dummy light-emitting element DED1 and the third dummy light-emitting element DED3, the sixth light-emitting element ED6 may be arranged between the first dummy light-emitting element DED1 and the second dummy light-emitting element DED2, the seventh dummy light-emitting element ED7 may be arranged to be apart in the third direction (e.g., the −Y-axis direction) from the third dummy light-emitting element DED3, and the eighth light-emitting element ED8 may be arranged to be apart in the second direction (e.g., the −X-axis direction) from the fourth dummy light-emitting element DED4.

In such an embodiment, the first light-emitting element ED1, the first dummy light-emitting element DED1, the fourth light-emitting element ED4, and the fourth dummy light-emitting element DED4 may be configured to emit light of a first color. The sixth light-emitting element ED6 and the seventh light-emitting element ED7 may be configured to emit light of the second color. The second light-emitting element ED2, the second dummy light-emitting element DED2, the third light-emitting element ED3, the third dummy light-emitting element DED3, the fifth light-emitting element ED5, and the eighth light-emitting element ED8 may be configured to emit light of the third color. The first color, the second color, and the third color may be different colors from each other. In an embodiment, for example, the first color may be red, the second color may be blue, and the third color may be green.

Figure 10:
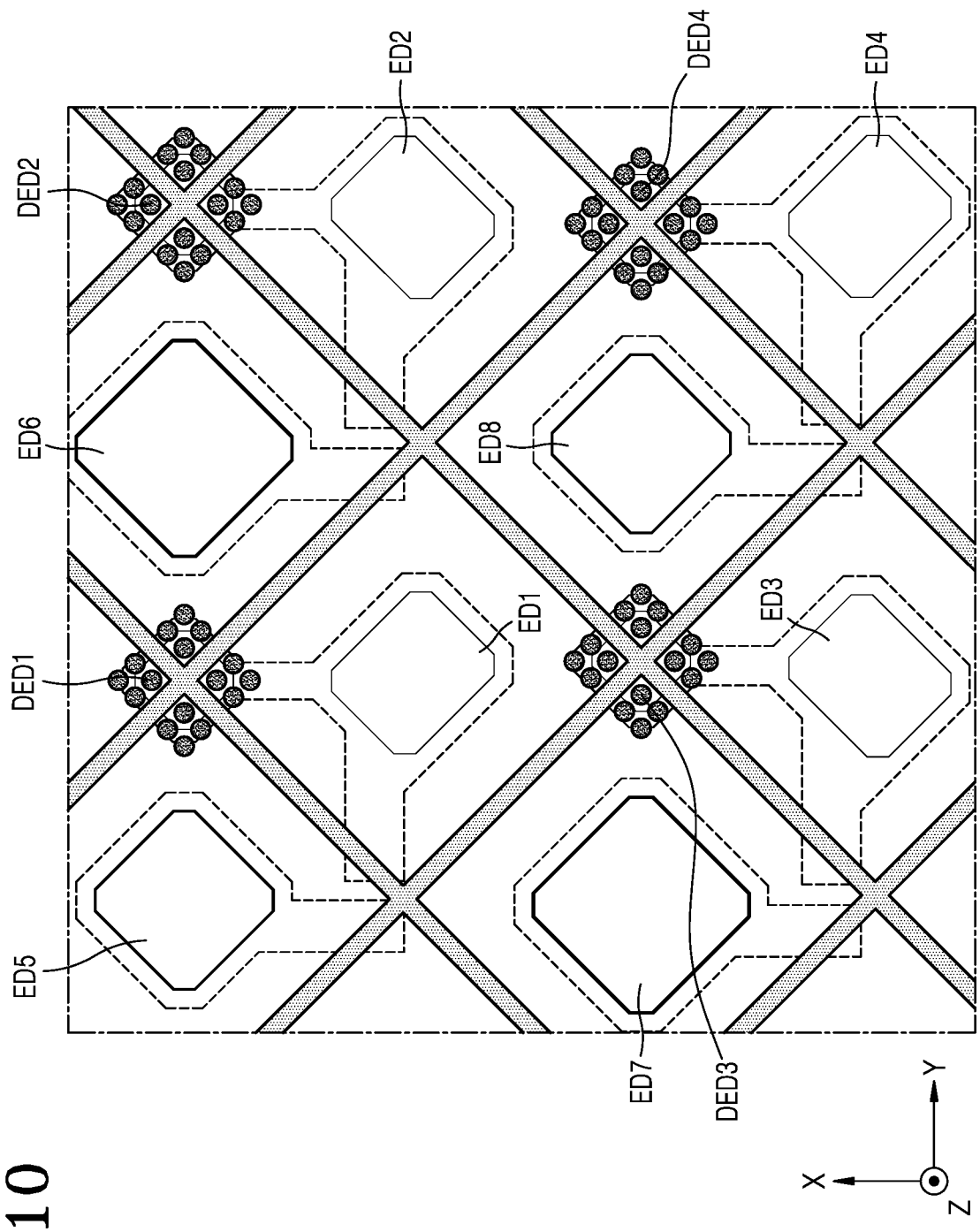

Referring to FIG. 10, in another alternative embodiment, the first light-emitting element ED1 may be arranged between the first dummy light-emitting element DED1 and the third dummy light-emitting element DED3, the second light-emitting element ED2 may be arranged between the second dummy light-emitting element DED2 and the fourth dummy light-emitting element DED4, the third light-emitting element ED3 may be arranged to be apart in the second direction (e.g., the −X-axis direction) from the third dummy light-emitting element DED3, and the fourth light-emitting element ED4 may be arranged to be apart in the second direction (e.g., the −X-axis direction) from the fourth dummy light-emitting element DED3 and the fourth dummy light-emitting element DED4.

The fifth light-emitting element ED5 may be arranged to be apart in the third direction (e.g., the −Y-axis direction) from the first dummy light-emitting element DED1, the sixth light-emitting element ED6 may be arranged to be apart in the third direction (e.g., the −Y-axis direction) from the second dummy light-emitting element DED2, the seventh light-emitting element ED7 may be arranged in the third direction (e.g., the −Y-axis direction) from the third dummy light-emitting element DED3, and the eighth light-emitting element ED8 may be arranged in the third direction (e.g., the −Y-axis direction) from the fourth dummy light-emitting element DED4.

In such an embodiment, the fifth light-emitting element ED5 and the eighth light-emitting element ED8 may be configured to emit light of the first color. The sixth light-emitting element ED6 and the seventh light-emitting element ED7 may be configured to emit light of the second color. The first light-emitting element ED1, the first dummy light-emitting element DED1, the second light-emitting element ED2, the second dummy light-emitting element DED2, the third light-emitting element ED3, the third dummy light-emitting element DED3, the fourth light-emitting element ED4, and the fourth dummy light-emitting element DED4 may be configured to emit light of the third color.

The first color, the second color, and the third color may be different colors from each other. In an embodiment, for example, the first color may be red, the second color may be blue, and the third color may be green. In an embodiment, an external light reflection phenomenon may be severer in the light-emitting element configured to emit green light. Accordingly, in such an embodiment, the first dummy light-emitting element DED1, the second dummy light-emitting element DED2, the third dummy light-emitting element DED3, and the fourth dummy light-emitting element DED4 are configured to emit green light, and the external light reflection phenomenon of the display apparatus may be reduced.

According to embodiments of a display apparatus, as described herein, brightness may be secured (or improved), and simultaneously, an external light reflection phenomenon that external light is reflected to a light-emitting element and viewed by users may be reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
   a substrate;
   a first light-emitting element disposed over the substrate, wherein the first light-emitting element emits light;
   a first dummy light-emitting element disposed over the substrate, wherein first dummy light-emitting element emits light of a same color as a color of the light emitted from the first light-emitting element;
   an input sensing layer disposed on the first light-emitting element and the first dummy light-emitting element; and
   a light-blocking layer disposed on the input sensing layer, wherein an opening is defined through the light-blocking layer to overlap the first light-emitting element, wherein the input sensing layer includes a diffraction structure disposed to overlap the first dummy light-emitting element.

2. The display apparatus of claim 1, wherein
the input sensing layer includes at least one insulating layer, and
at least one hole is defined through a portion of the at least one insulating layer corresponding to the diffraction structure.

3. The display apparatus of claim 2, wherein the input sensing layer further includes an upper insulating layer at least partially filling the at least one hole.

4. The display apparatus of claim 3, wherein a refractive index of the upper insulating layer is less than a refractive index of the at least one insulating layer.

5. The display apparatus of claim 2, wherein
the at least one insulating layer includes a first sub-insulating layer and a second sub-insulating layer on the first sub-insulating layer, and
a refractive index of the second sub-insulating layer is less than a refractive index of the first sub-insulating layer.

6. The display apparatus of claim 1, further comprising:
a pixel circuit comprising a thin-film transistor and a storage capacitor,
wherein the pixel circuit is electrically connected to the first light-emitting element and the first dummy light-emitting element.

7. The display apparatus of claim 1, wherein each of the first light-emitting element and the first dummy light-emitting element comprises:
a first electrode;
a light-emitting material disposed on the first electrode; and
a second electrode disposed on the light-emitting material,
wherein the first electrode of the first light-emitting element is connected to the first electrode of the first dummy light-emitting element.

8. The display apparatus of claim 1, wherein
the input sensing layer includes a plurality of touch electrodes, and
the plurality of touch electrodes includes metal lines crossing each other to have a mesh shape in a plan view, wherein each of the metal lines extends from a crossing point of the metal lines, and
the first dummy light-emitting element overlaps the crossing point of the metal lines.

9. The display apparatus of claim 1, wherein the light-blocking layer overlaps the first dummy light-emitting element.

10. The display apparatus of claim 1, further comprising:
a second dummy light-emitting element arranged to be adjacent to the first dummy light-emitting element and spaced apart in a first direction from the first dummy light-emitting element;
a third dummy light-emitting element arranged to be adjacent to the first dummy light-emitting element and spaced apart from the first dummy light-emitting element in a second direction crossing the first direction; and
a fourth dummy light-emitting element spaced apart in the first direction from the third dummy light-emitting element and spaced apart in the second direction from the second dummy light-emitting element.

11. The display apparatus of claim 10, wherein
the first dummy light-emitting element emits light of a same color as a color of light of the fourth dummy light-emitting element, and
the second dummy light-emitting element emits light of a same color as a color of light of the third dummy light-emitting element, which is different from the color of light of the fourth dummy light-emitting element.

12. The display apparatus of claim 10, wherein
the first dummy light-emitting element emit lights of a color different from a color of light of the fourth dummy light-emitting element, and
the second dummy light-emitting element emits light of a color different from a color of light of the third dummy light-emitting element.

13. The display apparatus of claim 10, wherein the first dummy light-emitting element, the second dummy light-emitting element, the third dummy light-emitting element, and the fourth dummy light-emitting element emit light of a same color as each other.

14. A display apparatus comprising:
a substrate;
a first light-emitting element disposed over the substrate, wherein the first light-emitting element emits light;
a first dummy light-emitting element disposed over the substrate, wherein the first dummy light-emitting element emits light of a same color as a color of the light emitted from the first light-emitting element;
a light-blocking layer disposed on the first light-emitting element and the first dummy light-emitting element, wherein the light-blocking layer includes a light-blocking portion, through which an opening is defined, the opening corresponds to the first light-emitting element, and the light-blocking portion corresponds to the first dummy light-emitting element; and
at least one insulating layer disposed between the first dummy light-emitting element and the light-blocking layer, wherein the at least one insulating layer includes a diffraction structure in which at least one hole is defined to overlap the first dummy light-emitting element.

15. The display apparatus of claim 14, further comprising
a bank layer disposed on a first electrode of the first light-emitting element, wherein a first light-emitting opening is defined through the bank layer to overlap the first electrode,
wherein a width of the first light-emitting opening of the bank layer is less than a width of the opening of the light-blocking layer.

16. The display apparatus of claim 14, wherein a first electrode of the first dummy light-emitting element is connected to the first electrode of the first light-emitting element.

17. The display apparatus of claim 16, further comprising:
an upper insulating layer disposed on the at least one insulating layer and partially filling the at least one hole of the diffraction structure.

18. The display apparatus of claim 17, wherein a refractive index of the upper insulating layer is less than a refractive index of the at least one insulating layer.

19. The display apparatus of claim 14, wherein
the at least one insulating layer includes a first sub-insulating layer and a second sub-insulating layer on the first sub-insulating layer, and
a refractive index of the second sub-insulating layer is less than a refractive index of the first sub-insulating layer.

20. The display apparatus of claim 14, further comprising:
a plurality of touch electrodes disposed on the first light-emitting element and the first dummy light-emitting element,
wherein the plurality of touch electrodes includes metal lines crossing each other to have a mesh shape in a plan view, wherein each of the metal lines extends from a crossing point of the metal lines, and
the first dummy light-emitting element overlaps the crossing point of the metal lines.

* * * * *